(12) United States Patent
Katayama et al.

(10) Patent No.: US 7,585,429 B2
(45) Date of Patent: Sep. 8, 2009

(54) PIEZOELECTRIC CERAMIC COMPOSITION

(75) Inventors: Ryoko Katayama, Higashiomi (JP);
Shinichiro Kawada, Hikone (JP);
Katsuhiro Horikawa, Toyama-ken (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 12/187,919

(22) Filed: Aug. 7, 2008

(65) Prior Publication Data
US 2008/0290316 A1  Nov. 27, 2008

Related U.S. Application Data

(63) Continuation of application No. PCT/JP2006/324221, filed on Dec. 5, 2006.

(30) Foreign Application Priority Data

Feb. 17, 2006  (JP) ............................ 2006-040694

(51) Int. Cl.
*H01L 41/187* (2006.01)
(52) U.S. Cl. .................. 252/62.9 R; 501/134
(58) Field of Classification Search ............ 252/62.9 R; 501/134
See application file for complete search history.

(56) References Cited

U.S. PATENT DOCUMENTS

| | | | |
|---|---|---|---|
| 6,083,415 A * | 7/2000 | Kimura et al. ........ | 252/62.9 R |
| 2002/0066882 A1 | 6/2002 | Nishida et al. | |
| 2004/0058797 A1 | 3/2004 | Nonoyama et al. | |
| 2006/0006360 A1 | 1/2006 | Takao et al. | |

FOREIGN PATENT DOCUMENTS

| | | |
|---|---|---|
| JP | 2002068835 | 3/2002 |
| JP | 2004244301 | 9/2004 |
| JP | 2005179144 | 7/2005 |

OTHER PUBLICATIONS

International Search Report.

* cited by examiner

*Primary Examiner*—C. Melissa Koslow
(74) *Attorney, Agent, or Firm*—Dickstein, Shapiro, LLP.

(57) ABSTRACT

A piezoelectric ceramic composition represented by the formula $(1-x)(K_{1-a-b}Na_aLi_b)_m(Nb_{1-c-d}Ta_cSb_d)O_3-x(K_{1/4}Na_{1/4}M3_{1/2})M4O_3$, wherein M3 represents a metal element that is at least one of Yb, Y, In, Nd, Eu, Gd, Dy, Sm, Ho, Er, Tb, and Lu; M4 represents a metal element that is at least one of Ti, Zr, and Sn; and x, a, b, c, d, and m satisfy the inequalities $0.001 \leq x \leq 0.1$, $0 \leq a \leq 0.9$, $0 \leq b \leq 0.3$, $0 \leq a+b \leq 0.9$, $0 \leq c \leq 0.5$, $0 \leq d \leq 0.1$, and $0.7 \leq m \leq 1.3$. The piezoelectric ceramic composition is not sintering resistant and has desired, sufficient piezoelectric properties as well as a sufficient firing temperature range suitable for mass production. Furthermore, the piezoelectric ceramic composition is effective in preventing insufficient polarization and effective in increasing the yield of products.

20 Claims, 1 Drawing Sheet

PIEZOELECTRIC CERAMIC COMPOSITION

This is a continuation of application Ser. No. PCT/JP2006/324221, filed Dec. 5, 2006.

TECHNICAL FIELD

The present invention relates to a piezoelectric ceramic composition suitable for piezoelectric actuators, piezoelectric sounding bodies, and piezoelectric sensors.

BACKGROUND ART

Conventional ceramic materials having large piezoelectric constants, such as lead zirconate titanate, (PZT) are used for piezoelectric components such as piezoelectric actuators, piezoelectric sounding bodies, and piezoelectric sensors.

In recent years, many attempts have been made to develop lead-free piezoelectric ceramic materials, or which contain substantially no lead, because of concerns about the influence of lead on the environment.

Niobate compounds are examples of the lead-free piezoelectric ceramic materials, particularly alkali niobate-based composite oxides, which have high Curie points and relatively large electromechanical coefficients and therefore are expected to be possible ceramic materials for piezoelectric components.

Patent Document 1 discloses a piezoelectric ceramic composition which is one of the alkali metal niobate-based piezoelectric ceramic compositions. The piezoelectric ceramic composition has an open porosity of 0.4% or less by volume and contains a metal element and a principal component represented by the formula I $\{Li_x(K_{1-y}Na_y)_{1-x}\}(Nb_{1-z-w}Ta_zSb_w)O_3$, wherein $0 \leq x \leq 0.2$, $0 \leq y \leq 1$, $0 < Z \leq 0.4$, and $0 < w \leq 0.2$. The metal element is at least one selected from the group consisting of Ag, Al, Au, B, Ba, Bi, Ca, Ce, Co, Cs, Cu, Dy, Er, Eu, Fe, Ga, Gd, Ge, Hf, Ho, In, Ir, La, Lu, Mg, Mn, Nd, Ni, Pd, Pr, Pt, Rb, Re, Ru, Sc, Si, Sm, Sn, Sr, Tb, Ti, Tm, V, Y, Yb, Zn, and Zr. The ratio of the metal element to the principal component is 0.0005:1 to 0.15:1 on a molar basis.

The alkali metal niobate-based piezoelectric ceramic compositions are usually resistant to sintering and therefore have a low apparent density and have pores in their surface and/or internal portions after being fired.

As disclosed in Patent Document 1, the piezoelectric ceramic composition contains 0.0005 to 0.15 mole of the metal element per mole of the principal component, which is represented by the above formula. The metal element serves as a sintering aid for increasing density. This allows the piezoelectric ceramic composition to have improved sintering resistance, high apparent density, and a smaller number of pores.

Patent Document 2, as well as Patent Document 1, discloses a piezoelectric ceramic composition containing a metal element and a principal component represented by the formula $\{Li_x(K_{1-y}Na_y)_{1-x}\}(Nb_{1-z-w}Ta_zSb_w)O_3$, wherein $0 \leq x \leq 0.2$, $0 \leq y \leq 1$, $0 < Z \leq 0.4$, and $0 < w \leq 0.2$. The metal element is at least one selected from the group consisting of Mg, Ca, Sr, and Ba. The ratio of the metal element to the principal component is 0.0001:1 to 0.10:1 on a molar basis.

As disclosed in Patent Document 2, the piezoelectric ceramic composition contains 0.0001 to 0.10 mole of the metal element per mole of the principal component, which is represented by the above formula. This allows the piezoelectric ceramic composition to have improved properties such as a high piezoelectric constant and high mechanical strength.

The alkali metal niobate-based piezoelectric ceramic compositions are inferior in piezoelectric properties to PZT-based piezoelectric ceramic compositions.

Patent Document 1: Japanese Unexamined Patent Application Publication No. 2004-244300
Patent Document 2: Japanese Unexamined Patent Application Publication No. 2004-244301

DISCLOSURE OF INVENTION

Problems to be Solved by the Invention

The piezoelectric ceramic composition disclosed in Patent Document 1 is improved in sinterability as described above and therefore probably has an improved piezoelectric constant, which is, however, not as large as desired. Although the sinterability of this piezoelectric ceramic composition is improved when 0.0005 to 0.15 mole of the metal element is added to one mole of the principal component, the firing temperature range of this piezoelectric ceramic composition is extremely narrow; hence, the firing temperature thereof needs to be precisely controlled. Therefore, there is a problem in that this piezoelectric ceramic composition is unsuitable for mass production.

The piezoelectric ceramic composition disclosed in Patent Document 2, as well as that disclosed in Patent Document 1, is improved in piezoelectric constant; however, the piezoelectric constant thereof is not sufficiently high. This piezoelectric ceramic composition has good mechanical strength but is, however, insufficiently polarized because of its low insulating properties. Therefore, this piezoelectric ceramic composition has a problem in that the yield of products is low.

The present invention has been made in view of the foregoing circumstances. It is an object of the present invention to provide a piezoelectric ceramic composition which is improved in sintering resistance so as to have sufficient piezoelectric properties suitable for piezoelectric ceramic electronic components, which is suitable for mass production because the firing temperature range thereof is sufficient, and which is effective in increasing the yield of products because insufficient polarization is prevented.

Means for Solving the Problems

The inventors have made intensive investigations to achieve the above object. As a result, the inventors have found that a piezoelectric ceramic composition can be produced when the following oxide and compound are mixed together and the mixture is melted: one mole of an alkali metal niobate-based composite oxide containing a principal component represented by the formula $(K, Na, Li)_m(Nb, Ta, Sb)O_3$ and 0.001 to 0.1 mole of a metal compound containing a specific trivalent metal element M3 and a specific tetravalent metal element M4. The piezoelectric ceramic composition has improved sinterability and desired, good piezoelectric properties. Furthermore, the piezoelectric ceramic composition has a sufficient firing temperature range and is effective in preventing insufficient polarization.

The specific trivalent metal element M3 is selected so as to have an ion radius less than that of K. The specific trivalent metal element M3 and the principal component are mixed together at a ratio of 0.001:1 to 0.1:1 on a molar basis and the mixture is calcined, whereby K is partly replaced with the specific trivalent metal element M3 to form a solid solution in the principal component. This allows the piezoelectric ceramic composition to have improved sinterability and desired, good piezoelectric properties.

The principal component has a perovskite structure (the formula $ABO_3$). The specific trivalent metal element M3 forms a solid solution not only in the A-site of the alkali metal niobate-based composite oxide but also in the B-site thereof. However, it is difficult to control the ratio of the solid solution in the A-site to that in the B-site. Therefore, the piezoelectric ceramic composition is likely to have unstable properties because the firing temperature of the mixture needs to be precisely controlled or it is difficult to polarize the piezoelectric ceramic composition.

The inventors have further made intensive investigations. As a result, the inventors have found that the firing temperature range can be enlarged so as to be suitable for mass production and insufficient polarization can be prevented such that the yield of products is increased by the following procedure: the specific trivalent metal element M3 and the specific tetravalent metal element M4 are mixed with the principal component in such a state that the specific trivalent and tetravalent metal elements M3 and M4 coexist and the mixture is then calcined.

The present invention has been made on the basis of the above findings. A piezoelectric ceramic composition according to the present invention is represented by the formula $(1-x)(K_{1-a-b}Na_aLi_b)_m(Nb_{1-c-d}Ta_cSb_d)O_3-x(K_{1/4}Na_{1/4}M3_{1/2})M4O_3$, wherein M3 represents a metal element that is at least one selected from the group consisting of Yb, Y, In, Nd, Eu, Gd, Dy, Sm, Ho, Er, Tb, and Lu; M4 represents a metal element that is at least one selected from the group consisting of Ti, Zr, and Sn; and x, a, b, c, d, and m satisfy the inequalities $0.001 \leq x \leq 0.1$, $0 \leq a \leq 0.9$, $0 \leq b \leq 0.3$, $0 \leq a+b \leq 0.9$, $0 \leq c \leq 0.5$, $0 \leq d \leq 0.1$, and $0.7 \leq m \leq 1.3$.

In the piezoelectric ceramic composition, x preferably satisfies the inequality $0.001 \leq x \leq 0.05$ and a and b preferably satisfy the inequality $0.5 \leq a \leq 0.6$ and the inequality $0 \leq b \leq 0.05$, respectively.

In the piezoelectric ceramic composition, c and d preferably satisfy the inequality $0 \leq c \leq 0.3$ and the inequality $0 \leq d \leq 0.01$, respectively and m preferably satisfies the inequality $1.0 \leq x \leq 1.05$.

ADVANTAGES

According to the present invention, a piezoelectric ceramic composition is represented by the formula $(1-x)(K_{1-a-b}Na_aLi_b)_m(Nb_{1-c-d}Ta_cSb_d)O_3-x(K_{1/4}Na_{1/4}M3_{1/2})M4O_3$, wherein M3 represents a metal element that is at least one selected from the group consisting of Yb, Y, In, Nd, Eu, Gd, Dy, Sm, Ho, Er, Tb, and Lu; M4 represents a metal element that is at least one selected from the group consisting of Ti, Zr, and Sn; and x, a, b, c, d, and m satisfy the inequalities $0.001 \leq x \leq 0.1$ (preferably $0.001 \leq x \leq 0.05$), $0 \leq a \leq 0.9$ (preferably $0.5 \leq a \leq 0.6$), $0 \leq b \leq 0.3$ (preferably $0 \leq b \leq 0.05$), $0 \leq a+b \leq 0.9$, $0 \leq c \leq 0.5$ (preferably $0 \leq c \leq 0.3$), $0 \leq d \leq 0.1$ (preferably $0 \leq d \leq 0.01$), and $0.7 \leq m \leq 1.3$ (preferably $1.0 \leq m \leq 1.05$). Therefore, the piezoelectric ceramic composition has improved sinterability and good piezoelectric properties. Furthermore, the piezoelectric ceramic composition has a wide firing temperature range suitable for mass production and is effective in preventing insufficient polarization such that the yield of products can be increased.

BEST MODES FOR CARRYING OUT THE INVENTION

Figure 1:
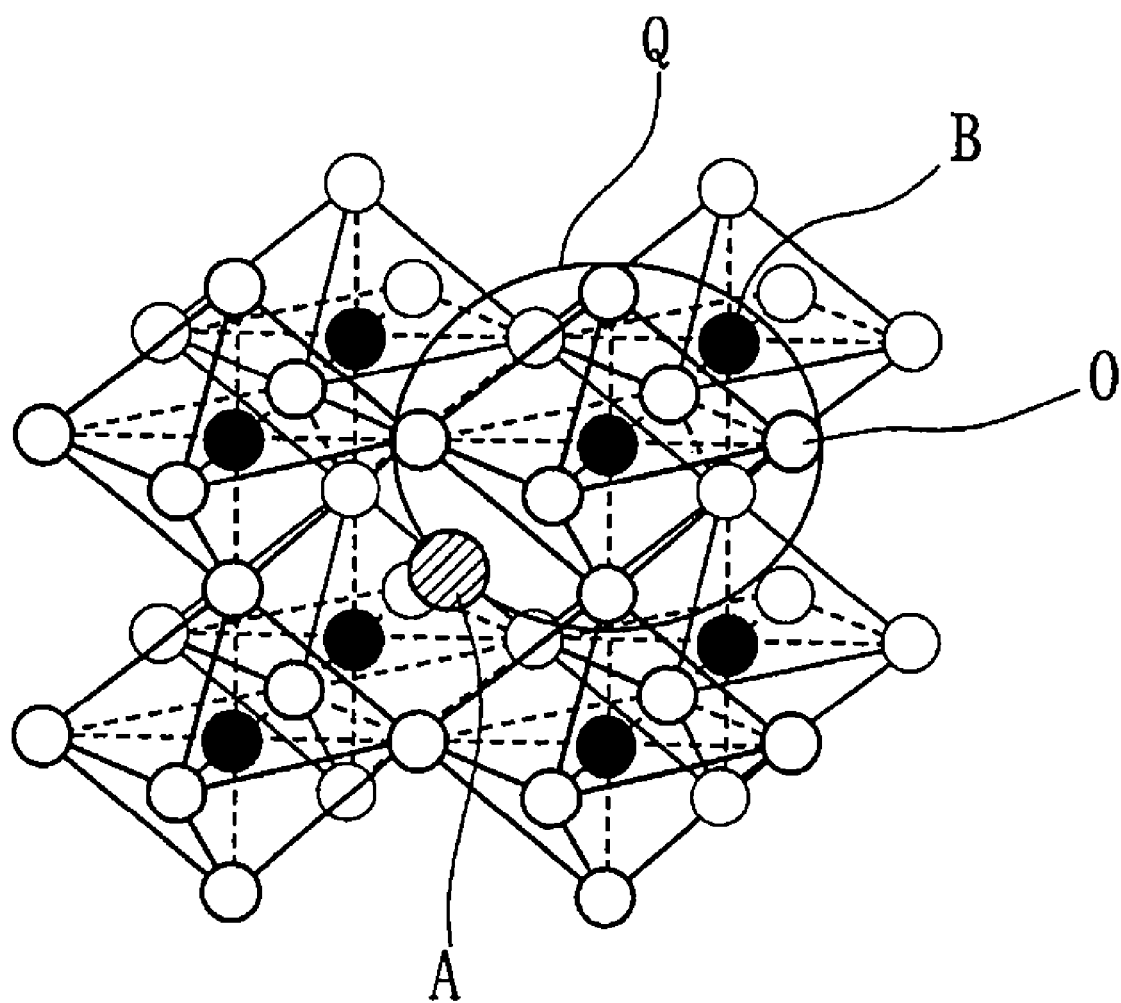
FIG. 1 is a schematic three-dimensional view of a perovskite oxygen-octahedral structure.

Embodiments of the present invention will now be described in detail.

A piezoelectric ceramic composition according to a first embodiment of the present invention is represented by Formula (A) below.

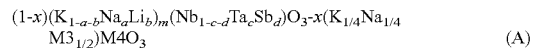

$$(1-x)(K_{1-a-b}Na_aLi_b)_m(Nb_{1-c-d}Ta_cSb_d)O_3-x(K_{1/4}Na_{1/4}M3_{1/2})M4O_3 \quad (A)$$

That is, the piezoelectric ceramic composition contains a principal component represented by the formula $(K_{1-a-b}Na_aLi_b)_m(Nb_{1-c-d}Ta_cSb_d)O_3$ and a complementary component represented by the formula $(K_{1/4}Na_{1/4}M3_{1/2})M4O_3$ at a predetermined ratio, the complementary component being present in the form of a solid solution.

In this formula, M3 represents specific trivalent metal elements. In particular, the trivalent metal element is at least one selected from the group consisting of Yb, Y, In, Nd, Eu, Gd, Dy, Sm, Ho, Er, Tb, and Lu.

M4 represents specific tetravalent metal elements. In particular, the tetravalent metal element is at least one selected from the group consisting of Ti, Zr, and Sn.

In Formula (A), x, a, b, c, d, and m satisfy Inequalities (1) to (7) below.

$$0.001 \leq x \leq 0.1 \quad (1)$$

$$0 \leq a \leq 0.9 \quad (2)$$

$$\mathbf{0} \leq \mathbf{b} \leq \mathbf{0.3} \quad (3)$$

$$0 \leq a+b \leq 0.9 \quad (4)$$

$$0 \leq c \leq 0.5 \quad (5)$$

$$0 \leq d \leq 0.1 \quad (6)$$

$$0.7 \leq m \leq 1 \quad (7)$$

Since the piezoelectric ceramic composition, which is represented by Formula (A) and is alkali metal niobate-based one, satisfies Inequalities (1) to (7), the piezoelectric ceramic composition has improved sinterability, desired good piezoelectric properties, and a sufficient firing temperature range suitable for mass production. The piezoelectric ceramic composition is effective in preventing insufficient polarization and therefore is effective in increasing the yield of products because.

The piezoelectric ceramic composition, which is alkali metal niobate-based one, has a perovskite structure (the formula $ABO_3$). In the perovskite structure, oxygen octahedrons containing B-site ions located at center positions form a framework and an A-site ion is situated in a space present in the framework as shown in FIG. 1. In this FIGURE, Q represents the framework formed of the oxygen octahedrons, black circles represent the B-site ions, a hatched circle represents the A-site ion, and white circles represent $O^{2-}$ ions.

For $KNbO_3$ in which the A-site is occupied by K and the B-site is occupied by Nb, $K^+$ which is an A-site ion is situated in a space present in a framework formed of oxygen octahedrons. The oxygen octahedrons contain B cite ions, such as Nb5+, which are located at center positions thereof.

If a K compound and an Nb compound are mixed together and the mixture is calcined such that $KNbO_3$ is synthesized, the mixture is hardly sintered. This is because Nb has an ion radius of 0.078 nm and K has an ion radius of 0.152 nm, that is, the ion radius of K is far greater than that of Nb. The framework of the B-site is formed of Nb, which has such a small ion radius, and therefore has a small space. Hence, it is difficult for K, which has such a large ion radius, to enter the A-site.

According to this embodiment, the K occupying the A-site is partly replaced with the specific trivalent metal element M3. The specific trivalent metal element M3 has an ion radius less than that of K and is present in the A-site in the form of a solid solution. This allows the piezoelectric ceramic composition to have improved sinterability and good piezoelectric properties.

The specific trivalent metal element M3, which has an ion radius less than that of K, is at least one selected from the group consisting of Yb, Y, In, Nd, Eu, Gd, Dy, Sm, Ho, Er, Tb, and Lu.

It is not preferable to use La, which is a metal element having an ion radius smaller than that of K. This is because although La has an ion radius of 0.117 nm, that is, the ion radius of La is smaller than that of K, the space in the framework formed of Nb is small and the ion radius of La is not so small that La is present at the A-site in the form of a solid solution. Therefore, La is not effective in improving sinterability.

Since the K is partly replaced with the specific trivalent metal element M3, the specific trivalent metal element M3 is present at the A-site in the form of a solid solution. Since K is monovalent, the replacement of K with the specific trivalent metal element M3 causes an imbalance in charge. In order to compensate for the charge imbalance, the specific trivalent metal element M3 serves as an acceptor and forms a solid solution at the B-site.

It is very difficult to control the percentage of the solid solution. The firing temperature needs to be precisely controlled or insufficient polarization may occur.

According to this embodiment, raw materials of the principal component are mixed together such that a specific tetravalent metal element M4, which has an ion radius close to that of Nb, coexists with the trivalent metal element M3. The mixture is calcined such that the specific tetravalent metal element M4 forms a solid solution at the B-site. This allows the firing temperature range to be expanded so as to be suitable for mass production and prevents insufficient polarization.

In the case where the specific trivalent metal element M3 and the specific tetravalent metal element M4 are added to $KNbO_3$ and this mixture is used for synthesis, the specific trivalent metal element M3 occupies the A-site and the specific tetravalent metal element M4, which is greater in valence than the specific trivalent metal element M3 and has an ion radius close to that of Nb, predominantly occupies the B-site. That is, the specific tetravalent metal element M4 serves as an acceptor and forms a solid solution at the B-site. This allows the charges to be balanced.

Furthermore, this allows the piezoelectric ceramic composition to be improved in sinterability, allows the piezoelectric ceramic composition to have desired good piezoelectric properties, and allows the firing temperature range thereof to be expanded. Therefore, the firing temperature of the piezoelectric ceramic composition need not be precisely controlled and is suitable for mass production and the piezoelectric ceramic composition is effective in preventing insufficient polarization.

The specific tetravalent metal element M4, which has an ion radius close to that of Nb, is at least one selected from the group consisting of Zr, Ti, and Sn as described above.

The reasons why x, a, b, c, d, and m are limited to the ranges defined by Inequalities (1) to (7) are described below in detail.

(1) x

In Formula (A), x represents the molar ratio of the complementary component $(K_{1/4}Na_{1/4}M3_{1/2})M4O_3$ to the principal component $(K_{1-a-b}Na_aLi_b)_m(Nb_{1-c-d}Ta_cSb_d)O_3$. When the molar ratio x thereof is less than 0.001, the content of the complementary component is insufficient to improve sinterability. When the molar ratio x thereof is greater than 0.1, the content of the complementary component is excessive and therefore the amount of the specific trivalent metal element M3 and that of the specific tetravalent metal element M4 are too large to form solid solutions in the principal component. Excessive amounts of these metal elements segregate at grain boundaries to form conductive layers. This causes a reduction in insulation; hence, it is difficult to perform polarization.

According to this embodiment, the principal component and the complementary component are mixed together such that the molar ratio x of the complementary component to the principal component is preferably 0.001 to 0.1 and more preferably 0.001 to 0.05.

(2) a and b

As is clear from Inequalities (1) to (7), the piezoelectric ceramic composition principally contains potassium niobate $(KNbO_3)$. K, which is an A-site component of the potassium niobate, may be partly replaced with Na or Li as required.

When the molar replacement rate a of Na, the molar replacement rate b of Li, or the sum of the molar replacement rate a of Na and the molar replacement rate b of Li is greater than 0.9, 0.3, or 0.9, respectively, it is difficult to perform polarization because of a reduction in insulation. That is, when the content of Na and/or Li in the principal component exceeds the above values, Na and/or Li segregate at grain boundaries to form a Na or Li phase because the amount of Na and/or Li is too large to form a solid solution in crystal grains. That is, conductive layers made of Na or Li are formed. This causes a reduction in insulation; hence, it is difficult to perform polarization.

According to this embodiment, the composition of the principal component is adjusted such that the molar replacement rate a of Na with respect to K is 0.9 or less and more preferably 0.6 or less, the molar replacement rate b of Li is 0.3 or less and more preferably 0.05 or less, and the sum of the molar replacement rate a of Na and the molar replacement rate b of Li is 0.9 or less.

In order to achieve good piezoelectric properties even if a large electric field (for example, 1 kV/mm) is applied, the molar replacement rate a of Na is preferably 0.5 or more.

(3) c and d

The piezoelectric ceramic composition principally contains potassium niobate $(KNbO_3)$ as described above. Nb, which is a B-site component of potassium niobate, may be partly replaced with Ta or Sb as required.

When the molar replacement rate c of Ta is greater than 0.5, the piezoelectric ceramic composition is significantly reduced in electromechanical coefficient, piezoelectric constant, and Curie point. Furthermore, the firing temperature range of the piezoelectric ceramic composition is narrow and therefore is unsuitable for mass production and the piezoelectric ceramic composition has low insulation properties and therefore may be insufficiently polarized. This may cause a reduction in the yield of products.

When the molar replacement rate d of Sb is greater than 0.1, the piezoelectric ceramic composition has low insulation properties and therefore it is difficult to polarize the piezoelectric ceramic composition.

Therefore, the composition of the principal component is adjusted such that the molar replacement rate c of Ta is preferably 0.5 or less and more preferably 0.3 or less and the molar replacement rate d of Sb is preferably 0.1 or less and more preferably 0.01 or less.

(4) m

In Formula (A), m represents the molar ratio of the A-site to the B-site and is stoichiometrically 1.00. The piezoelectric ceramic composition need not have a stoichiometric composition.

When the molar ratio m is less than 0.7, the content of the A-site is excessively small and the piezoelectric ceramic composition is significantly reduced in electromechanical coefficient, and piezoelectric constant. Therefore, the piezoelectric ceramic composition has low insulation properties and may be insufficiently polarized. This may cause a reduction in the yield of products.

When the molar ratio m is greater than 1.3, the content of the A-site is excessively large. This may cause a reduction in sinterability.

Therefore, the composition of the principal component is adjusted such that the molar ratio m of the A-site to the B-site preferably ranges from 0.7 to 1.3 and more preferably 1.0 to 1.05.

According to this embodiment, since the piezoelectric ceramic composition, which is represented by Formula (A), satisfies Inequalities (1) to (7), the piezoelectric ceramic composition has improved sinterability, sufficient piezoelectric properties, and a wide firing temperature range; hence, the firing temperature of the piezoelectric ceramic composition need not be precisely controlled and therefore is suitable for mass production. The piezoelectric ceramic composition can be prevented from being insufficiently polarized. This leads to an increase in the yield of products.

In particular, the piezoelectric ceramic composition has an electromechanical coefficient kp of 23% or more, a piezoelectric constant $d_{33}$ of 95 pC/N or more, a Curie point Tc of 265° C. or more, and a firing temperature range of 40° C. or more and can be prevented from being insufficiently polarized.

The piezoelectric ceramic composition can be produced as described below.

For raw materials of the principal component, $K_2CO_3$ and $Nb_2O_5$ are prepared and at least one of $Na_2CO_3$, $Li_2CO_3$, $Ta_2O_5$, and $Sb_2O_5$ is further prepared as required. A metal compound containing the specific trivalent metal element M3 is prepared, the metal compound being at least one selected from the group consisting of $Yb_2O_3$, $Y_2O_3$, $In_2O_3$, $Nd_2O_3$, $Eu_2O_3$, $Gd_2O_3$, $Dy_2O_3$, $Sm_2O_3$, $Ho_2O_3$, $Er_2O_3$, $Tb_2O_3$, and $Lu_2O_3$. A metal compound containing the specific tetravalent metal element M4 is prepared, the metal compound being at least one selected from the group consisting of $TiO_2$, $ZrO_2$, and $SnO_2$.

These materials are weighed such that the fired piezoelectric ceramic composition satisfies Formula (A) Inequalities (1) to (7). These materials are fed into a ball mill and then wet-mixed together with an organic solvent such as an alcohol or acetone. The mixture is dried, calcined at a temperature of 700° C. to 1000° C., and then pulverized, whereby a calcined powder is obtained. The calcined powder is kneaded together with a binder, whereby a ceramic slurry is obtained.

The ceramic slurry is formed into green ceramic sheets by a known process such as a doctor blade process. A predetermined number of the green ceramic sheets are stacked and then fired at a temperature of 1050° C. to 1200° C., whereby a piezoelectric sintered body (piezoelectric ceramic composition) is obtained.

The piezoelectric sintered body can be readily processed into a desired piezoelectric ceramic electronic component.

For example, a pair of electrodes made of Au or the like are formed on both end surfaces of the piezoelectric sintered body by a sputtering process or the like. The piezoelectric sintered body is polarized in such a manner that the piezoelectric sintered body is placed into oil maintained at 20° C. to 180° C. and then supplied with a direct current electric field of 2 to 10 kV/mm, whereby a desired piezoelectric ceramic electronic component is obtained.

The present invention is not limited to the above embodiment. The alkali compounds, the specific trivalent metal element M3, and the specific tetravalent metal element M4 are not particularly limited and may be used in the form of a carbonate, an oxide, or a hydroxide.

Examples of the present invention will now be described in detail.

EXAMPLES

For raw materials of principal components, $K_2CO_3$, $Nb_2O_5$, $Na_2CO_3$, $Li_2CO_3$, $Ta_2O_5$, and $Sb_2O_5$ were prepared. Metal compounds containing trivalent metal elements were prepared, the metal compounds being $Yb_2O_3$, $Y_2O_3$, $In_2O_3$, $Nd_2O_3$, $Eu_2O_3$, $Gd_2O_3$, $Dy_2O_3$, $Sm_2O_3$, $Ho_2O_3$, $Er_2O_3$, $Tb_2O_3$, $Lu_2O_3$, and $La_2O_3$. Metal compounds containing tetravalent metal elements were prepared, the metal compounds being $TiO_2$, $ZrO_2$, and $SnO_2$.

These materials were weighed such that each fired piezoelectric ceramic composition had a composition shown in Table 1. The weighed materials were fed into a ball mill and then wet-mixed together with an alcohol.

The mixture was dried, calcined at 900° C., and then pulverized, whereby a calcined powder was obtained. The pre-fired powder was kneaded together with a water-soluble binder, whereby a ceramic slurry was obtained.

The ceramic slurry was formed into green ceramic sheets having a thickness of 60 μm by a doctor blade process. Twenty of the green ceramic sheets were stacked, whereby a laminate with a thickness of 1.2 mm was obtained.

The laminate was punched into disk-shaped pieces having a diameter of 10 mm. The disk-shaped pieces were fired at a temperature of 1050° C. to 1200° C. Piezoelectric sintered bodies were prepared from Samples 1 to 44 by this procedure. Firing temperatures for preparing the piezoelectric sintered bodies from Samples 1 to 44 were varied in increments of 5° C. within a range from 1050° C. to 1200° C.

Each piezoelectric sintered body was subjected to a sputtering process using an Au target, whereby electrodes were formed on both end surfaces of the piezoelectric sintered body. The piezoelectric sintered body was polarized in such a manner that the piezoelectric sintered body was placed into 80° C. silicone oil and then supplied with a direct current electric field of 3 kV/mm for 30 minutes. Piezoelectric components were prepared from Samples 1 to 44 by this procedure.

Specimens prepared from Samples 1 to 44 at different firing temperatures were measured for piezoelectric constant $d_{33}$ at a frequency of 100 Hz using a $d_{33}$ meter (a piezoelectric $d_{33}$ meter available from Channel Products, Inc.).

The firing temperature at which a maximum piezoelectric constant $d_{33}$ was achieved was defined as an optimum firing temperature. Twenty specimens prepared from each of Samples 1 to 44 at the optimum firing temperature were measured for dielectric constant $\epsilon r$, electromechanical coefficient kp, piezoelectric constant $d_{33}$, and Curie point Tc and also measured for the piezoelectric constant $d_{33}$ when an electric field of 1 kV/mm was applied to the specimens (hereinafter referred to as "high-field piezoelectric constant").

In particular, the specimens were measured for dielectric constant $\epsilon r$ and electromechanical coefficient kp by a resonance-antiresonance method using an impedance analyzer (4294A, available from Agilent Technologies).

The high-field piezoelectric constant of each piezoelectric sintered body was measured by applying an electric field of 1 kV/mm to the piezoelectric sintered body in the thickness direction thereof, the change in thickness of the piezoelectric sintered body was measured, the change per unit thickness was determined, and the change per unit thickness was divided by the intensity of the electric field applied thereto.

The temperature behavior of dielectric constant $\epsilon r$ for each piezoelectric sintered body was measured and the temperature at which the piezoelectric sintered body had a maximum dielectric constant $\epsilon r$ was determined to be the Curie point Tc thereof.

Twenty specimens prepared from each of Samples 1 to 44 were checked if the specimens were polarized, whereby the percentage of the specimens insufficiently polarized was determined. Whether the specimens were well polarized was determined by checking if the piezoelectric constant $d_{33}$ of the specimens was measurable. The specimens of which the piezoelectric constant $d_{33}$ was not measurable were determined to be insufficiently polarized.

Table 1 shows the compositions of Samples 1 to 44. Table 2 shows the average of the measurements of the 20 specimens prepared from each sample.

Table 3 shows the temperature ranges in which the specimens prepared from Samples 1 to 44 and also shows the firing temperature ranges $\Delta T$ of the specimens prepared therefrom. The firing temperature of a piezoelectric sintered body having a piezoelectric constant $d_{33}$ which is 80% or more of the piezoelectric constant $d_{33}$ of one fired at an optimum temperature is defined as a sinterable temperature at which such a piezoelectric sintered body can be stably obtained. The lower limit of the sinterable temperature is defined as a minimum firing temperature $T_L$, the upper limit thereof is defined as a maximum firing temperature $T_H$, and the difference therebetween is defined as a firing temperature range $\Delta T$ (=$T_H$ - $T_L$). Table 3 summarizes these values.

TABLE 1

$(1-x)(K_{1-a-b}Na_aLi_b)_m(Nb_{1-c-d}Ta_cSb_d)O_3-x(K_{1/4}Na_{1/4}M3_{1/2})M4O_3$

| Sample No. | a | b | a+b | c | d | m | x | M3 | M4 |
|---|---|---|---|---|---|---|---|---|---|
| 1 | 0.55 | 0 | 0.55 | 0 | 0 | 1.00 | 0.005 | Yb | Ti |
| 2 | 0.55 | 0 | 0.55 | 0 | 0 | 1.00 | 0.005 | Yb | Zr |
| 3 | 0.55 | 0 | 0.55 | 0 | 0 | 1.00 | 0.005 | Yb | Sn |
| 4 | 0.55 | 0 | 0.55 | 0 | 0 | 1.00 | 0.005 | Y | Ti |
| 5 | 0.55 | 0 | 0.55 | 0 | 0 | 1.00 | 0.005 | In | Ti |
| 6 | 0.55 | 0 | 0.55 | 0 | 0 | 1.00 | 0.005 | Nd | Ti |
| 7 | 0.55 | 0 | 0.55 | 0 | 0 | 1.00 | 0.005 | Eu | Ti |
| 8 | 0.55 | 0 | 0.55 | 0 | 0 | 1.00 | 0.005 | Gd | Ti |
| 9 | 0.55 | 0 | 0.55 | 0 | 0 | 1.00 | 0.005 | Dy | Ti |
| 10 | 0.55 | 0 | 0.55 | 0 | 0 | 1.00 | 0.005 | Sm | Ti |
| 11 | 0.55 | 0 | 0.55 | 0 | 0 | 1.00 | 0.005 | Ho | Ti |
| 12 | 0.55 | 0 | 0.55 | 0 | 0 | 1.00 | 0.005 | Er | Ti |
| 13 | 0.55 | 0 | 0.55 | 0 | 0 | 1.00 | 0.005 | Tb | Ti |
| 14 | 0.55 | 0 | 0.55 | 0 | 0 | 1.00 | 0.005 | Lu | Ti |
| 15* | 0.55 | 0 | 0.55 | 0 | 0 | 1.00 | 0.005 | La | Ti |
| 16* | 0.55 | 0 | 0.55 | 0 | 0 | 1.00 | 0 | — | — |
| 17 | 0.55 | 0 | 0.55 | 0 | 0 | 1.00 | 0.001 | Yb | Ti |
| 18 | 0.55 | 0 | 0.55 | 0 | 0 | 1.00 | 0.010 | Yb | Ti |
| 19 | 0.55 | 0 | 0.55 | 0 | 0 | 1.00 | 0.050 | Yb | Ti |
| 20 | 0.55 | 0 | 0.55 | 0 | 0 | 1.00 | 0.100 | Yb | Ti |
| 21* | 0.55 | 0 | 0.55 | 0 | 0 | 1.00 | 0.150 | Yb | Ti |
| 22 | 0 | 0 | 0 | 0 | 0 | 1.00 | 0.005 | Yb | Ti |
| 23 | 0.50 | 0 | 0.50 | 0 | 0 | 1.00 | 0.005 | Yb | Ti |
| 24 | 0.60 | 0 | 0.60 | 0 | 0 | 1.00 | 0.005 | Yb | Ti |
| 25 | 0.90 | 0 | 0.90 | 0 | 0 | 1.00 | 0.005 | Yb | Ti |
| 26* | 1.00 | 0 | 1.00 | 0 | 0 | 1.00 | 0.005 | Yb | Ti |
| 27 | 0.55 | 0.05 | 0.60 | 0 | 0 | 1.00 | 0.005 | Yb | Ti |
| 28 | 0.55 | 0.10 | 0.65 | 0 | 0 | 1.00 | 0.005 | Yb | Ti |
| 29 | 0.55 | 0.30 | 0.85 | 0 | 0 | 1.00 | 0.005 | Yb | Ti |
| 30* | 0.55 | 0.40 | 0.95 | 0 | 0 | 1.00 | 0.005 | Yb | Ti |
| 31* | 0.70 | 0.30 | 1.00 | 0 | 0 | 1.00 | 0.005 | Yb | Ti |
| 32 | 0.55 | 0 | 0.55 | 0.10 | 0 | 1.00 | 0.005 | Yb | Ti |
| 33 | 0.55 | 0 | 0.55 | 0.30 | 0 | 1.00 | 0.005 | Yb | Ti |
| 34 | 0.55 | 0 | 0.55 | 0.50 | 0 | 1.00 | 0.005 | Yb | Ti |
| 35* | 0.55 | 0 | 0.55 | 0.60 | 0 | 1.00 | 0.005 | Yb | Ti |
| 36 | 0.55 | 0 | 0.55 | 0 | 0.01 | 1.00 | 0.005 | Yb | Ti |
| 37 | 0.55 | 0 | 0.55 | 0 | 0.05 | 1.00 | 0.005 | Yb | Ti |
| 38 | 0.55 | 0 | 0.55 | 0 | 0.10 | 1.00 | 0.005 | Yb | Ti |
| 39* | 0.55 | 0 | 0.55 | 0 | 0.15 | 1.00 | 0.005 | Yb | Ti |
| 40* | 0.55 | 0 | 0.55 | 0 | 0 | 0.50 | 0.005 | Yb | Ti |
| 41 | 0.55 | 0 | 0.55 | 0 | 0 | 0.70 | 0.005 | Yb | Ti |
| 42 | 0.55 | 0 | 0.55 | 0 | 0 | 1.05 | 0.005 | Yb | Ti |
| 43 | 0.55 | 0 | 0.55 | 0 | 0 | 1.30 | 0.005 | Yb | Ti |
| 44* | 0.55 | 0 | 0.55 | 0 | 0 | 1.50 | 0.005 | Yb | Ti |

Asterisked samples are outside the scope of the present invention.

TABLE 2

| Sample No. | Dielectric constant $E_r$ (—) | Electromechanical coefficient kp (%) | Piezoelectric constant $d_{33}$ (pC/N) | High-field piezoelectric constant $d_{33}$ (pC/N) | Curie point Tc (° C.) | Percentage of insufficiently polarized specimens (%) |
|---|---|---|---|---|---|---|
| 1 | 500 | 33.4 | 130 | 230 | 400 | 0 |
| 2 | 490 | 32.6 | 115 | 220 | 400 | 0 |
| 3 | 485 | 32.8 | 120 | 220 | 400 | 0 |
| 4 | 490 | 31.2 | 115 | 210 | 390 | 0 |
| 5 | 460 | 28.7 | 95 | 170 | 410 | 0 |
| 6 | 475 | 30.3 | 105 | 190 | 410 | 0 |
| 7 | 470 | 30.2 | 110 | 195 | 400 | 0 |
| 8 | 465 | 30.2 | 105 | 195 | 405 | 0 |
| 9 | 450 | 30.1 | 105 | 190 | 400 | 0 |
| 10 | 470 | 31.3 | 105 | 185 | 400 | 0 |
| 11 | 460 | 29.5 | 100 | 175 | 405 | 0 |
| 12 | 450 | 32.6 | 115 | 200 | 400 | 0 |
| 13 | 455 | 32.8 | 120 | 210 | 400 | 0 |
| 14 | 440 | 31.9 | 115 | 210 | 410 | 0 |

TABLE 2-continued

| Sample No. | Dielectric constant $E_r$ (—) | Electromechanical coefficient kp (%) | Piezoelectric constant $d_{33}$ (pC/N) | High-field piezoelectric constant $d_{33}$ (pC/N) | Curie point Tc (°C.) | Percentage of insufficiently polarized specimens (%) |
|---|---|---|---|---|---|---|
| 15* | | | Insufficiently sintered | | | |
| 16* | | | Insufficiently sintered | | | |
| 17 | 500 | 33.2 | 130 | 225 | 400 | 0 |
| 18 | 500 | 33.0 | 125 | 220 | 400 | 0 |
| 19 | 490 | 32.6 | 115 | 210 | 395 | 0 |
| 20 | 485 | 29.4 | 110 | 190 | 390 | 0 |
| 21* | | | Insufficiently polarized | | | |
| 22 | 380 | 33.5 | 100 | 185 | 420 | 0 |
| 23 | 500 | 33.1 | 125 | 225 | 400 | 0 |
| 24 | 505 | 33.3 | 130 | 230 | 395 | 0 |
| 25 | 530 | 30.2 | 110 | 200 | 380 | 0 |
| 26* | | | Insufficiently polarized | | | |
| 27 | 500 | 33.3 | 130 | 230 | 400 | 0 |
| 28 | 510 | 31.8 | 110 | 210 | 395 | 0 |
| 29 | 515 | 30.8 | 105 | 200 | 395 | 0 |
| 30* | | | Insufficiently polarized | | | |
| 31* | | | Insufficiently polarized | | | |
| 32 | 585 | 32.5 | 125 | 220 | 390 | 0 |
| 33 | 650 | 27.5 | 120 | 200 | 340 | 0 |
| 34 | 820 | 23.2 | 115 | 190 | 265 | 5 |
| 35* | 960 | 5.1 | 25 | 35 | 210 | 75 |
| 36 | 515 | 33.1 | 120 | 230 | 390 | 0 |
| 37 | 555 | 30.6 | 115 | 220 | 355 | 0 |
| 38 | 600 | 25.5 | 115 | 190 | 310 | 0 |
| 39* | | | Insufficiently polarized | | | |
| 40* | 505 | 8.8 | 35 | 50 | 390 | 20 |
| 41 | 505 | 29.7 | 100 | 190 | 395 | 0 |
| 42 | 500 | 33.2 | 125 | 230 | 400 | 0 |
| 43 | 495 | 32.4 | 110 | 210 | 395 | 0 |
| 44* | | | Insufficiently sintered | | | |

Asterisked samples are outside the scope of the present invention.

TABLE 3

| Sample No. | Firing temperature | | |
|---|---|---|---|
| | Minimum firing temperature $T_L$ (°C.) | Maximum firing temperature $T_H$ (°C.) | Firing temperature range $\Delta T$ (°C.) |
| 1 | 1055 | 1110 | 55 |
| 2 | 1060 | 1110 | 50 |
| 3 | 1060 | 1110 | 50 |
| 4 | 1060 | 1110 | 50 |
| 5 | 1060 | 1115 | 55 |
| 6 | 1060 | 1110 | 50 |
| 7 | 1060 | 1110 | 50 |
| 8 | 1065 | 1110 | 45 |
| 9 | 1065 | 1110 | 45 |
| 10 | 1060 | 1110 | 50 |
| 11 | 1060 | 1110 | 50 |
| 12 | 1060 | 1110 | 50 |
| 13 | 1060 | 1110 | 50 |
| 14 | 1060 | 1110 | 50 |
| 15* | | Insufficiently sintered | |
| 16* | | Insufficiently sintered | |
| 17 | 1055 | 1110 | 55 |
| 18 | 1060 | 1115 | 55 |
| 19 | 1070 | 1110 | 40 |
| 20 | 1070 | 1110 | 40 |
| 21* | | Insufficiently polarized | |
| 22 | 1065 | 1110 | 45 |
| 23 | 1060 | 1115 | 55 |
| 24 | 1060 | 1115 | 55 |
| 25 | 1070 | 1115 | 45 |
| 26* | | Insufficiently polarized | |
| 27 | 1060 | 1115 | 55 |
| 28 | 1060 | 1115 | 55 |
| 29 | 1070 | 1115 | 45 |
| 30* | | Insufficiently polarized | |
| 31* | | Insufficiently polarized | |
| 32 | 1070 | 1115 | 45 |
| 33 | 1070 | 1110 | 40 |
| 34 | 1070 | 1110 | 40 |
| 35* | 1080 | 1110 | 30 |
| 36 | 1060 | 1110 | 50 |
| 37 | 1065 | 1110 | 45 |
| 38 | 1065 | 1110 | 45 |
| 39* | | Insufficiently polarized | |
| 40* | 1085 | 1110 | 25 |
| 41 | 1060 | 1100 | 40 |
| 42 | 1060 | 1110 | 50 |
| 43 | 1060 | 1110 | 50 |
| 44* | | Insufficiently sintered | |

Asterisked samples are outside the scope of the present invention.

As is clear from Tables 1 to 3, Sample 15 contains La, which is outside the scope of the present invention, instead of a trivalent metal element M3 and therefore is insufficiently sintered when being fired at a temperature of 1050° C. to 1200° C. This means that Sample 15 is inferior in sinterability. This is probably because La has an ion radius which is less than that of K but greater than that of the trivalent metal element M3, which is specified herein, and therefore it is difficult for La to form a solid solution at an A-site.

In Sample 16, the piezoelectric sintered body (piezoelectric ceramic composition) contains the principal component only and does not contain a complementary component containing the trivalent metal element M3 or a tetravalent metal element M4. Therefore, Sample 16 is insufficiently sintered.

Sample 21 contains a principal component and a complementary component. The molar ratio x of the complementary component to the principal component is 0.150, that is, the molar ratio x thereof is greater than 0.10; hence, 20 specimens prepared from Sample 21 are all insufficiently polarized. This is probably because since the content of the complementary component is excessive and therefore the amount of Yb, which is an example of the trivalent metal element M3, and the amount of Ti, which is an example of the tetravalent metal element M4, are too large to form solid solutions in the principal component, excessive amounts of Yb and of Ti segregate at grain boundaries to form conductive layers and therefore the specimens have low insulating properties.

In Sample 26, the molar replacement rate a of Na with respect to K is 1.00, that is, the molar replacement rate a thereof is greater than 0.90; hence, 20 specimens prepared from Sample 26 are all insufficiently polarized. This is probably because since the content of Na in a principal component is excessive and therefore the amount of Na is too large to form a solid solution in crystal grains, an excessive amount of Na segregates at grain boundaries to form an Na phase and conductive layers are formed from the Na phase, which causes the specimens to have low insulating properties.

In Sample 30, the molar replacement rate b of Li with respect to K is 0.40, that is, the molar replacement rate b thereof is greater than 0.30; hence, 20 specimens prepared from Sample 30 are all insufficiently polarized. This is probably because conductive layers are formed from a Li phase for the same reason as that of Sample 26 and therefore the specimens have low insulating properties.

In Sample 31, the molar replacement rate a of Na is 0.70 and the molar replacement rate b of Li is 0.30, that is, both of them are within the scope of the present invention. However, the sum of the molar replacement rate a of Na and the molar replacement rate b of Li is 1.00, that is, the sum thereof is greater than 0.90 and therefore is outside the scope of the present invention; hence, 20 specimens prepared from Sample 31 are all insufficiently polarized. This is probably because conductive layers are formed from a Li or Na phase for the same reason as that of Sample 26 and therefore the specimens have low insulating properties.

In Sample 35, the molar replacement rate c of Ta with respect to Nb is 0.60, that is, the molar replacement rate c thereof is greater than 0.50; hence, specimens have an extremely small electromechanical coefficient kp of 5.1%, a small piezoelectric constant $d_{33}$ of 25 pC/N, a small high-field piezoelectric constant $d_{33}$ of 35 pC/N, and a low Curie point of 210° C., that is, the specimens have significantly low piezoelectric properties. The percentage of the insufficiently polarized specimens is high, 75%. This may cause a reduction in the yield of products. The specimens have a narrow firing temperature range ΔT of 30° C. This suggests that Sample 35 is unsuitable for stably manufacturing piezoelectric components in a large scale.

In Sample 39, the molar replacement rate d of Sb with respect to Nb is 0.15, that is, the molar replacement rate d thereof is greater than 0.10; hence, 20 specimens prepared therefrom have low insulating properties and therefore are all insufficiently polarized.

In Sample 40, the molar ratio m of A-site component to B-site component is 0.50, that is, the molar ratio m thereof is less than 0.70; hence, specimens have an extremely small electromechanical coefficient kp of 8.8%, a small piezoelectric constant $d_{33}$ of 35 pC/N, and a small high-field piezoelectric constant $d_{33}$ of 50 pC/N, that is, the specimens have piezoelectric properties insufficient for practical use. The percentage of the insufficiently polarized specimens is 20%. This may cause a reduction in the yield of products. The specimens have a narrow firing temperature range ΔT of 25° C. This suggests that Sample 40 is unsuitable for stably manufacturing piezoelectric components in a large scale.

In Sample 44, the molar ratio m of A-site component to B-site component is 1.50, that is, the molar ratio m thereof is greater than 1.30; hence, specimens are insufficiently sintered.

The reason why the specimens prepared from Sample 40 or 44 are defective is probably that the molar ratio m is too far divorced from stoichiometry (m=1.00).

In Samples 1 to 14, 17 to 20, 22 to 25, 27 to 29, 32 to 34, 36 to 38, and 41 to 43, the molar ratio x, the molar replacement rates a, b, c, and d, and the molar ratio m satisfy the following inequalities: $0.001 \leq x \leq 0.1$, $0 \leq a \leq 0.9$, $0 \leq b \leq 0.3$, $0 \leq a+b \leq 0.9$, $0 \leq c \leq 0.5$, $0 \leq d \leq 0.1$, and $0.7 \leq m \leq 1.3$. These samples contain a trivalent metal element M3 and tetravalent metal element M4 that are within the scope of the present invention. Therefore, specimens prepared from these samples an electromechanical coefficient kp of 23.2% to 33.5%, a piezoelectric constant $d_{33}$ of 95 to 130 pC/N, a high-field piezoelectric constant $d_{33}$ of 170 to 230 pC/N, and a Curie point Tc of 265° C. to 420° C., that is, the specimens have good piezoelectric properties. The percentage of the insufficiently polarized specimens is 5% or less. The specimens have a firing temperature range ΔT of 45° C. to 60° C., which is suitable for mass production.

Samples 17 to 19 in which the molar ratio x is 0.001 to 0.050 are far superior in piezoelectric properties to Sample 20 in which the molar ratio x is 0.100. This means that Samples 17 and 19 are more preferable than Sample 20.

Samples 23 and 24 in which the molar replacement rate a is 0.50 to 0.60 have a better improved piezoelectric constant $d_{33}$, a better high-field piezoelectric constant $d_{33}$, and a larger firing temperature range ΔT as compared to Samples 22 and 25 in which the molar replacement rate a is 0 or 0.9. This means that Samples 23 and 24 are more preferable than Samples 22 and 25.

Sample 27 in which the molar replacement rate b is 0.05 is superior in piezoelectric properties to Samples 28 and 29 in which the molar replacement rate b is 0.10 or 0.30. This means that Sample 27 is more preferable than Samples 28 and 29.

Although the percentage of the insufficiently polarized specimens prepared from Sample 34, in which the molar replacement rate c is 0.50, is 5%, the percentage of the insufficiently polarized specimens prepared from Sample 32 or 33 in which the molar replacement rate c is 0.10 or 0.30, respectively, is 0%. This shows that the molar replacement rate c is preferably 0.30 or less.

Sample 36 in which the molar replacement rate d is 0.01 is superior in piezoelectric properties to Samples 37 and 38 in which the molar replacement rate d is 0.05 or 0.10. This means that Sample 36 is more preferable than Samples 37 and 38.

Sample 42 in which the molar ratio m is 1.05 is superior in piezoelectric properties to Samples 41 and 43 in which the molar ratio m is 0.70 or 1.30. This shows that the molar ratio m, which may be preferably close to the stoichiometric ratio of 1.00, and is preferably within a range from 1.00 to 1.05.

The invention claimed is:

1. A piezoelectric ceramic composition which is represented by the formula

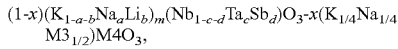
$(1-x)(K_{1-a-b}Na_aLi_b)_m(Nb_{1-c-d}Ta_cSb_d)O_3 \text{-} x(K_{1/4}Na_{1/4}M3_{1/2})M4O_3$, wherein M3 represents at least one metal element selected from the group consisting of Yb, Y, In, Nd, Eu, Gd, Dy, Sm, Ho, Er, Tb, and Lu; M4 represents at least one metal element selected from the group consisting of Ti, Zr, and Sn; and x, a, b, c, d, and m satisfy the following inequalities:

$0.001 \leq x \leq 0.1$, $0 \leq a \leq 0.9$, $0 \leq b \leq 0.3$, $0 \leq a+b \leq 0.9$, $0 \leq c \leq 0.5$, $0 \leq d \leq 0.1$, and $0.7 \leq m \leq 1.3$.

2. The piezoelectric ceramic composition according to claim 1, wherein x satisfies the inequality $0.001 \leq x \leq 0.05$.

3. The piezoelectric ceramic composition according to claim 2, wherein a and b satisfy the inequalities $0.5 \leq a \leq 0.6$ and $0 \leq b \leq 0.05$, respectively.

4. The piezoelectric ceramic composition according to claim 3, wherein c and d satisfy the inequalities $0 \leq c \leq 0.3$ and $0 \leq d \leq 0.01$, respectively.

5. The piezoelectric ceramic composition according to claim 4, wherein m satisfies the inequality $1.0 \leq m \leq 1.05$.

6. The piezoelectric ceramic composition according to claim 5, wherein M4 is Ti.

7. The piezoelectric ceramic composition according to claim 6, wherein M3 is Yb.

8. The piezoelectric ceramic composition according to claim 1, wherein a and b satisfy the inequalities $0.5 \leq a \leq 0.6$ and $0 \leq b \leq 0.05$, respectively.

9. The piezoelectric ceramic composition according to claim 1, wherein c and d satisfy the inequalities $0 \leq c \leq 0.3$ and $0 \leq d \leq 0.01$, respectively.

10. The piezoelectric ceramic composition according to claim 1, wherein m satisfies the inequality $1.0 \leq m \leq 1.05$.

11. The piezoelectric ceramic composition according to claim 1, wherein M4 is Ti.

12. The piezoelectric ceramic composition according to claim 1, wherein M3 is Yb.

13. A polarized piezoelectric ceramic composition according to claim 11.

14. A polarized piezoelectric ceramic composition according to claim 10.

15. A polarized piezoelectric ceramic composition according to claim 9.

16. A polarized piezoelectric ceramic composition according to claim 8.

17. A polarized piezoelectric ceramic composition according to claim 7.

18. A polarized piezoelectric ceramic composition according to claim 6.

19. A polarized piezoelectric ceramic composition according to claim 5.

20. A polarized piezoelectric ceramic composition according to claim 1.

* * * * *